Aug. 30, 1960 L. E. BARTON 2,951,208

TEMPERATURE CONTROLLED SEMI-CONDUCTOR BIAS CIRCUIT

Original Filed July 24, 1953

INVENTOR.
Loy E. Barton

BY [signature]

ATTORNEY

United States Patent Office 2,951,208

Patented Aug. 30, 1960

2,951,208

TEMPERATURE CONTROLLED SEMI-CONDUCTOR BIAS CIRCUIT

Loy E. Barton, Princeton, N.J., assignor to Radio Corporation of America, a corporation of Delaware Continuation of application Ser. No. 370,010, July 24, 1953. This application July 18, 1956, Ser. No. 598,586

17 Claims. (Cl. 330—14)

Figure 1:
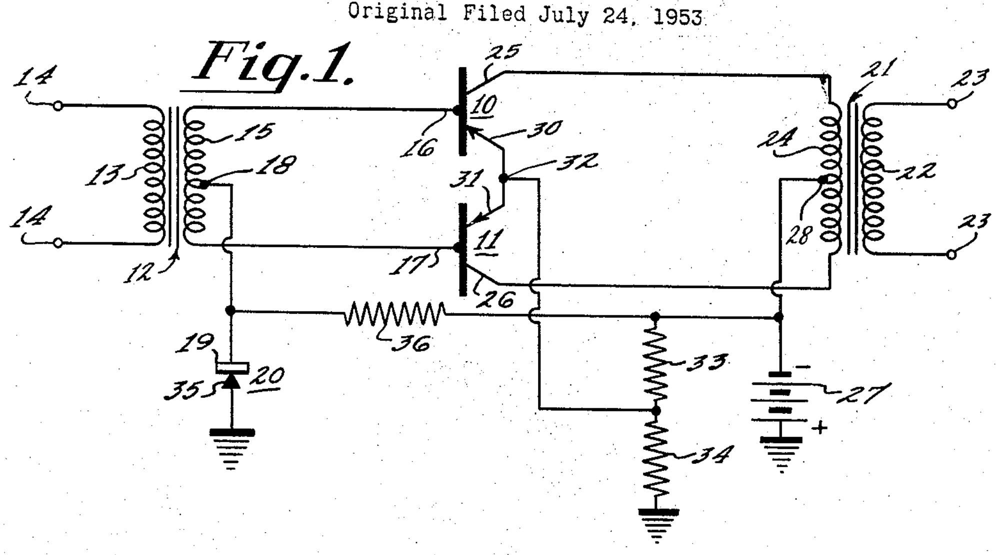

This application is a continuation of my copending application Serial Number 370,010, which was filed on July 24, 1953, for "Temperature Controlled Semi-Conductor Bias Circuit."

The present invention relates generally to signal translating and other electrical systems utilizing semi-conductor devices as active control and amplifying elements, and particularly to biasing or operating potential supply circuits for semi-conductor devices in such systems.

At the present state of the art, semi-conductor devices, and particularly semi-conductor devices comprising germanium, are highly temperature sensitive.

Semi-conductor devices, such as transistors, in systems of the type referred to, are normally subject to temperature variations arising from the variations in the ambient temperature and further under certain condition, to temperature rise by reason of the power dissipation in the semi-conductor devices themselves. This results in changes in certain operating characteristics in varying degree. Various feedback and current stabilization systems and methods are known which are helpful in compensating for such changes. However, for certain types of transistor amplifiers, notably audio frequency balanced or push-pull power amplifiers for Class B operation wherein the transistors are to be maintained essentially at cut-off in a zero signal condition, known systems and methods are not sufficiently effectual for practical use.

It is, therefore, an object of the present invention to provide an improved temperature-controlled bias circuit for semi-conductor devices that may be effective in connection with various electrical systems including transistor audio frequency power amplifiers and the like.

It is a further object of the present invention to provide an improved temperature controlled bias circuit adapted for use with transistors to compensate for undesired effects due to temperature changes.

It is still another object of the present invention to provide a temperature controlled bias circuit for transistors enabling stable Class B amplifier operation over a wide range of signal level variation.

It is a still further object of the present invention to provide an improved temperature controlled bias circuit for enabling stable efficient operation of transistors over a wide range of temperature variation with a minimum of circuit elements.

In accordance with one aspect of the present invention, a temperature responsive device, having a temperature coefficient substantially identical with that of a transistor, is utilized to establish the bias condition existing between the base and emitter electrodes of a transistor, or of a pair of transistors arranged, for example, in a Class B amplifier circuit.

In another form of the present invention, the temperature responsive element or device is thermally coupled with the semi-conductor device or transistor to efficiently compensate for the effects of variations in the temperature of the transistor, per se.

In accordance with a further feature of the present invention a unilateral conducting device is connected in circuit with the base and emitter electrodes of one or more transistors and poled in such a direction as to provide a low impedance path between these electrodes upon high current conditions when the temperature responsive element would otherwise provide a high impedance path therebetween.

Figure 2:
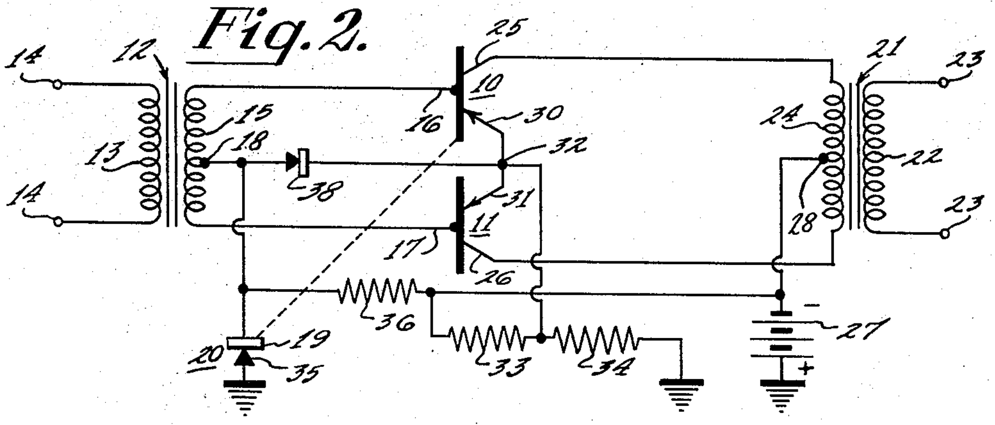
Figure 3:
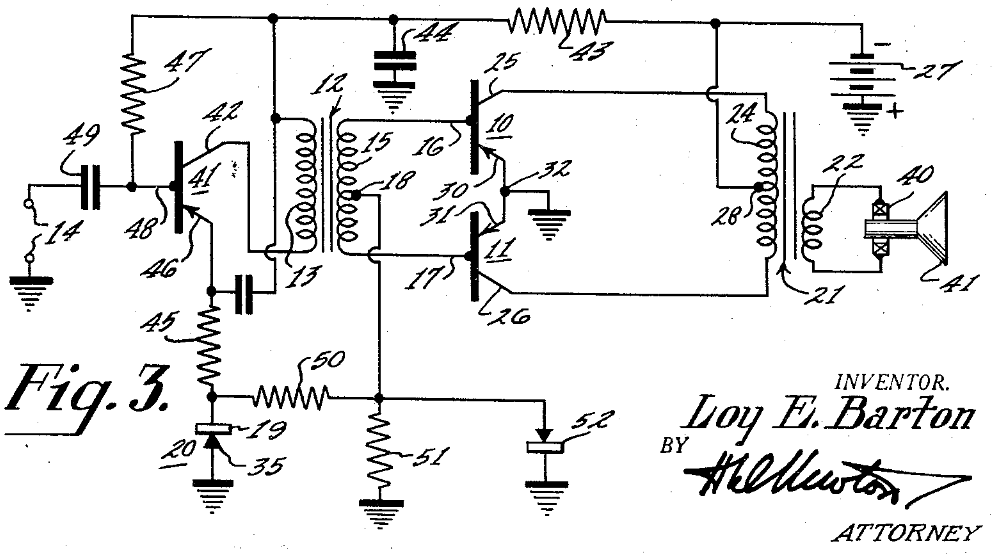

The novel features that are considered characteristic of this invention are set forth with particularity in the appended claims. The invention itself, however, both as to its organization and method of operation as well as additional objects and advantages thereof, will best be understood from the following description when read in connection with the accompanying drawing, in which:

Figure 1 is a schematic circuit diagram of a pair of semi-conductor devices or transistors arranged in a Class B push-pull amplifier circuit including a temperature controlled bias circuit in accordance with the present invention;

Figure 2 is a schematic circuit diagram of a pair of semi-conductor devices or transistors arranged in a Class B amplifier circuit and including a temperature controlled bias circuit having a temperature responsive element thermally coupled with at least one of the semi-conductor devices and adapted to provide improved temperature compensated bias for operation with low distortion at high current in accordance with the present invention; and Figure 3 is a schematic circuit diagram of a semi-conductor Class B push-pull amplifier circuit illustrating a further embodiment of the present invention.

Referring now to the drawing in which like reference characters identify like elements throughout the various figures and referring particularly to Figure 1, a push-pull amplifier circuit embodying the invention includes a pair of junction transistors 10 and 11. It is, of course, to be understood that the transistors 10 and 11 may be of either conductivity type, but that for the purpose of illustration they are chosen as P–N–P junction transistors, which are provided with bias voltages of proper polarity for transistor amplifier operation.

An input circuit for the pair of transistors 10 and 11 includes an input transformer 12 comprising a primary winding 13 provided with a pair of input terminals 14 and a secondary winding 15, which is connected respectively to the two base electrodes 16 and 17. A center tap 18 on the secondary winding 15 is connected to the cathode 19 of a temperature responsive bias device 20 as will be more fully hereinafter described.

The output circuit for the transistors 10 and 11 includes an output transformer 21 comprising an output winding 22 which is provided with a pair of output terminals 23 and further comprises a primary winding 24, which is connected respectively to the two collector electrodes 25 and 26.

Bias voltages for the various electrodes of the transistors 10 and 11 may be provided from any convenient direct current voltage source which is herein illustrated as a battery 27 connected between a center tap 28 on the primary winding 24 and a point of fixed reference potential such as chassis ground. It is noted that the polarity of the battery 27 is chosen to provide a reverse bias between the collector and base electrodes of each of the transistors 10 and 11, and as illustrated, provides the proper bias for junction transistors of the P–N–P type. If transistors of the opposite conductivity type were to be utilized, the polarity of the battery 27 would have to be reversed. It may be further noted that, if necessary, the voltage source or battery 27 may be by-passed by a suitable capacitor.

In order to complete the input and output circuits and to provide the necessary bias potential for the common electrodes of the transistors 10 and 11, the emitter electrodes 30 and 31 are connected to a common junction 32 which is in turn connected to the junction of a pair of voltage divider resistors 33 and 34, which are connected in shunt with the battery 27. Alternatively, and as shown in Figure 3, the emitters 30 and 31 may be connected directly to ground. Accordingly, it is readily seen that as is required for P-N-P transistors, the collector electrodes will be maintained at a voltage which is negative with reference to their respective base electrodes, and the emitter electrodes will be maintained at a voltage which is positive with reference to their respective base electrodes, that is the base electrodes will be more negative than the respective emitter electrodes.

In order to provide a bias voltage for the base to emitter electrode circuit which is temperature controlled, or in other words, which will vary in a predetermined prescribed manner with ambient temperature variations, the temperature controlled or responsive device 20, which is illustrated as a germanium semi-conductor junction diode having a low forward resistance and comprising the cathode 19 and an anode 35, is connected in series with a current limiting resistor 36 between the negative terminal of the battery 27 and ground.

Variation in the ambient temperature and of the temperature of the transistors 10 and 11 will vary the collector current of the transistors. This may result in undesirable distortion in a transistor amplifier and in the case of a class B push-pull stage of the type illustrated, distortion of the cross-over type. By connecting the diode 20 in the circuit as shown and in accordance with the invention, however, the base to emitter bias which is applied to the transistors 10 and 11 is varied as the temperature is varied. It is noted that the battery 27 is poled in the circuit so that the voltage drop across the diode 20, due to current flow from the battery, is of proper polarity to apply forward base to emitter bias to both of the transistors 10 and 11. That is to say, the voltage drop across the diode 20 is of such a polarity that the voltage which is applied to the bases 16 and 17 is negative relative to the voltage of respective emitter electrodes 30 and 31. If the ambient temperature rises, the temperature of the diode 20 will increase and the resistance of the diode 20 will decrease. Since the resistance of the diode 20 decreases the voltage drop thereacross will also decrease. In this way, the forward bias voltage which is applied between the emitters 30 and 31 and the respective base electrodes 16 and 17 of the transistors 10 and 11 is decreased to decrease the collector current and maintain this current at a substantially constant optimum value despite changes in ambient temperature. Should the temperature decrease, the reverse effects will prevail to effect a stabilization in collector current.

In the circuit as illustrated, it is essential that the forward resistance of the temperature responsive device 20 be low to prevent an excessive bias voltage for a given current through the resistor 36. It is readily seen that in the arrangement as illustrated the germanium diode 20 is in series with the base to emitter conductive paths of each of the two transistors 10 and 11. Accordingly, temperature responsive devices such as thermistors which would normally exhibit a relatively high impedance in the circuit wherein they are utilized are not preferred for this application. It has been found that a germanium diode which provided a voltage drop in the order of 3 tenths of a volt while being traversed by current in the order of 2 to 3 milliamperes provided adequate compensation for temperature variations without excessive loss of input signal.

It is, of course, desirable that the temperature controlled or responsive diode 20 have a temperature characteristic which is substantially identical to the temperature characteristics of the transistor with which it is connected. For example, in Figure 1 it has been found that a low forward resistance germanium semi-conductor diode, when utilized with germanium type junction transistors, exhibited a temperature characteristic which was sufficiently identical to the temperature characteristics of the transistor to establish stable operation over a wide range of temperatures.

It has further been found that when the temperature responsive device is not associated thermally (i.e., not thermally coupled) with transistors with which it is utilized and if the transistors are of the power type which generate considerable heat in their operation, the compensation will be primarily for ambient temperature variation and will not provide adequate compensation for the effects of changes in the temperature of the transistor itself caused by internally generated heat in contrast to ambient effects.

Accordingly in Figure 2 there is illustrated a temperature controlled bias circuit which is essentially identical with that shown in Figure 1. However, in this modification of the present invention the temperature controlled or responsive impedance element 20 is thermally coupled with at least one of the transistors 10 and 11. The thermal coupling is represented by the dotted line in Figure 2. Accordingly if the temperature of the transistor varies due to a relatively large power dissipation, such as in power transistors, a temperature compensation will occur as the temperature of the temperature responsive element 20 varies in a like manner. It is to be noted that this arrangement additionally compensates for ambient temperature variations.

It would, of course, be preferred that the temperature controlled or responsive impedance element 20 be characterized by equal bilateral conduction. However, such a device which can meet the other requirements of a low forward resistance and a substantially identical temperature characteristic with that of the transistors is not at present known. It is, therefore, seen that if the input current requirements to the two transistors 10 and 11 tend to exceed the static current which flows through the temperature responsive element 20, distortion will be developed as there will be an attempt to force current through the diode 20 in a reverse direction. However, this may be overcome by including a second germanium diode element 38 poled in a direction opposite to that of the temperature responsive element 20 and connected directly between the center tap 18 and the junction 32. With this second diode 38 connected in the circuit in this manner, it is readily seen that signal currents which would otherwise exceed the forward current flowing through the temperature responsive element 20 are provided with a low impedance path between the base and emitter electrodes through the second diode 38. Distortion as above discussed which might otherwise develop is, therefore, prevented.

Figure 3 illustrates a method of obtaining an essentially constant current source for the temperature controlled or responsive element 20 without the necessity of utilizing additional expensive circuit elements. The power amplifier stage including a pair of transistors 10 and 11 arranged in a push-pull transistor amplifier circuit is similar to the push-pull amplifier circuits discussed in connection with Figures 1 and 2. However, in this instance the circuit is adapted as an audio amplifier, and accordingly the secondary winding 22 of the output transformer is connected directly with the voice coil 40 of a transducer illustrated as a loudspeaker 41.

In order to provide an input signal of sufficient level to drive the Class B output stage, a driver amplifier circuit including a junction transistor 41 is coupled with the input transformer 12. Accordingly one terminal of the primary winding 13 is connected to the collector electrode 42 and the other terminal of the primary winding 13 is connected through a resistor 43 to the negative terminal of the battery 27 thereby providing the necessary collector bias voltage for the transistor 41. The resistor 43 and a capacitor 44 comprise a filter circuit.

The emitter-collector electrode circuit of the transistor 41 is completed through a resistor 45 which is connected between the emitter electrode 46 and the cathode 19 of the temperature responsive device 20. It is well known in the transistor art that the emitter electrode circuit of a transistor device, when provided with a circuit element such as the resistor 45, tends to provide a constant current through the elements connected in that circuit. Accordingly it is readily seen that the current which will be caused to flow through the temperature responsive device 20 will be essentially constant due to this characteristic of transistors.

A bias resistor 47 is connected between the base electrode 48 and the filter circuit comprising the resistor 43 and the capacitor 44 in order to establish the requisite voltage at the base electrode 48 to insure Class A transistor amplifier operation.

An input circuit for the transistor 41 comprises a pair of input terminals 14, one of which is connected to the base electrode 48 through a coupling capacitor 49, the other of which is connected to ground.

With this arrangement it has been found that the current through the temperature responsive device 20 may produce a voltage drop thereacross which is in excess of that required for Class B operation of the transistors 10 and 11. Accordingly a voltage divider network comprising a pair of resistors 50 and 51 is connected in shunt with the temperature responsive element 20 and the junction of the voltage divider resistors 50 and 51 is connected to the center tap 18 of the secondary winding 15. The emitter electrodes 30 and 31 are connected directly to ground. In this manner an appropriate voltage is developed across the voltage divider resistor 51 for biasing of the base-emitter electrode circuits of the transistors 10 and 11.

If the above described circuit is utilized as the audio amplifier circuit in a transistorized radio receiving system, it is possible to provide, by means of an additional voltage divider network, a temperature controlled bias for the second detector of the radio receiver system thereby reducing distortion which might otherwise occur due to the varying characteristics of the transistor second detector when subjected to ambient temperature variations.

If the temperature responsive element 20 is utilized to provide a bias voltage for other portions of a radio receiving system, it may be necessary to connect a second diode 52 in shunt with the voltage divider resistor 51 to prevent the voltage at the cathode 19 from becoming zero. It is readily seen that if the current requirements for the base electrodes 16 and 17, as above discussed, are equal to or in excess of the initial static current flowing through the temperature responsive element 20, there will be a cancellation of currents through the temperature responsive element 20 such that the net current flowing therethrough will be zero. Accordingly, there will be no voltage drop across the temperature responsive element 20 and the cathode 19 will be at ground potential. However, if a second diode 52 is connected in shunt with the voltage divider resistor 51 and poled in a direction opposite to that of the temperature responsive element 20, the negative peaks of signal current will then flow through the diode 52 and the voltage at the cathode 19 can be maintained above ground and utilized to bias additional elements of a radio receiving system.

In view of the fact that it is the impedance of the temperature controlled or responsive element which varies with temperature, it is desirable to provide an essentially constant current source for the temperature responsive element. When the temperature responsive element is provided with a substantially constant current source, the voltage variations, which will be developed thereacross due to the current flowing therethrough, will be a function of temperature variation only. If, on the other hand, the magnitude of the current which is caused to flow through the temperature responsive element also varies with temperature, the substantially complete temperature compensation which might otherwise be obtained with this bias circuit will not be fulfilled.

It is, of course, to be understood that whereas the specific circuits utilized to demonstrate the present invention have been discussed as adapted for Class B operation, it should be apparent that the present invention is equally applicable to other classes of transistor operation and other circuit arrangements.

It is preferred that the temperature responsive element be selected so as to provide essentially the same characteristics as those exhibited by the semi-conductor devices or transistors with which it is associated. Accordingly, at least in the present state of the art, if the transistors are selected to consist of germanium material, it is preferred that the temperature responsive element be also of germanium material. If, on the other hand, the transistors are selected to be of silicon or other semiconductive material, the temperature controlled or responsive element should be selected to be of the same or substantially identical semi-conductive material.

It is thus readily seen that the present invention provides a temperature controlled bias circuit which is simple, inexpensive and which provides efficient stable operation over a wide range of conditions.

What is claimed is:

1. In a signal translating system, the combination comprising; a semi-conductor device including base, emitter and collector electrodes and having the operating characteristic of collector current variation directly with temperature; direct-current supply means including circuit connections with said device for biasing said collector and base electrodes in a reverse direction and for biasing said base and emitter electrodes in a forward direction; a signal input circuit coupled between said base and emitter electrode; a signal output circuit coupled with said collector electrode; a temperature responsive semi-conductor diode connected between said base and emitter electrodes; and means connecting said supply source to apply a forward bias to said temperature responsive diode for providing across said device a voltage which varies with temperature and which is of a polarity to provide a forward bias voltage between said base and emitter electrodes, said device and said diode having conductance characteristics which vary in substantially the same manner with temperature variations.

2. In a push-pull signal amplifier system, the combination of, a pair of semi-conductor devices each including base, emitter, and collector electrodes, a signal input circuit coupled with said base and emitter electrodes, a signal output circuit coupled with said collector and emitter electrodes, a temperature responsive semi-conductor diode connected effectively between said base and emitter electrodes, direct current supply means connected with said diode to provide predetermined direct current flow in the forward direction therethrough, said supply source being poled in said circuit to provide a bias voltage across said diode of a polarity to provide a forward base-emitter bias for said semi-conductor devices which is variable in accordance with temperature variations, and a unilateral conducting device connected in circuit with said base and emitter electrodes and poled in a direction to provide a low impedance path between said base and emitter electrodes in response to high current condition of operation of said semi-conductor devices.

3. In a signal translating system, the combination of a pair of semi-conductor devices each including base, emitter, and collector electrodes and having the operating characteristic of collector current variation with temperature; direct current supply means connected with said devices for biasing said collector and base electrodes in a reverse direction and for biasing said base and emitter electrodes in a forward direction; a signal input circuit coupled with said base electrodes; a signal output circuit coupled with said collector electrodes; a temperature responsive semi-conductor diode effectively connected between said base and emitter electrodes; and means including said supply means providing a constant current source connected to traverse said temperature responsive diode in the forward direction to provide a bias voltage across said diode which is of a polarity to forward bias said emitter electrode relative to said base electrode and which varies inversely with temperature, said devices and said diode having conductance characteristics which vary in substantially the same manner with temperature variations.

4. A Class B push-pull semi-conductor signal translating system comprising, in combination, a pair of semi-conductor devices each including base, emitter, and collector electrodes, a signal input circuit coupled with said base electrodes, a signal output circuit coupled with said collector electrodes, a temperature responsive semi-conductor diode connected between said base electrodes and a point of fixed reference potential for said system, direct current supply means connected to provide substantially constant current through said temperature responsive diode in the forward direction to provide a voltage drop thereacross of a polarity to apply forward bias between said base and emitter electrodes, a voltage divider circuit connected in shunt wtih said temperature responsive diode, and circuit means connected to provide a conductive path between an intermediate point on said voltage divider circuit and said emitter electrodes, whereby the bias forward voltage applied between said base and emitter electrodes is variable with temperature.

5. In a semi-conductor amplifier system, the combination of, a semi-conductor device including a semi-conductive body and base, emitter and collector electrodes, said semi-conductive body being of a predetermined conductivity type, an input circuit connected to impress an alternating current signal wave between said base and emitter electrodes, an alternating current signal wave output circuit connected between said collector and emitter electrodes, a temperature responsive semi-conductor diode connected between said input circuit and a point of fixed reference potential for said system, said semi-conductor diode being of the same semi-conductive material as said semi-conductive body, a voltage divider network connected in shunt with said temperature responsive diode to apply a forward bias thereto, circuit means connecting an intermediate point of said voltage divider network with said base electrode, and a second diode connected in shunt with a portion of said voltage divider network and poled in a direction opposite to that of the temperature responsive diode, whereby the bias voltage applied between said base and emitter electrodes varies inversely with temperature.

6. In a balanced, Class B transistor signal translating system, the combination comprising, a pair of semi-conductor devices each including base, emitter, and collector electrodes, a signal input circuit coupled with said base electrodes, a signal output circuit coupled with said collector electrodes, a temperature controlled bias circuit including a temperature responsive semi-conductor diode connected between said base electrodes and a point of fixed reference potential for said system, direct-current supply means connected to provide substantially constant current through said temperature responsive diode in the forward direction whereby the bias voltage applied between said base and emitter electrodes varies with temperature, a voltage divider circuit connected in shunt with said temperature responsive diode, circuit means connected to provide a conductive path between an intermediate point on said voltage divider circuit and said emitter electrodes, and a unilateral conducting element connected serially between said base and emitter electrodes and adapted to provide a low impedance path therebetween upon high current conditions of operation of said semi-conductor devices.

7. In a semi-conductor signal amplifier system, a temperature controlled bias circuit for maintaining stable semi-conductor operation, said system comprising, in combination, a pair of semi-conductor devices each including a semi-conductive body having base, emitter and collector electrodes in contact therewith, said semi-conductive bodies each being of a predetermined conductivity type, a signal input circuit adapted to impress an alternating current signal wave between said base and emitter electrodes, an alternating current signal wave output circuit connected between said collector and emitter electrodes, said bias circuit comprising a temperature controlled semi-conductor diode connected in said input circuit between a point therein and a point of fixed reference potential for said system, said semi-conductor diode being of the same semi-conductive material as said semi-conductive bodies, means providing a substantially constant current source connected to provide a current through said temperature controlled diode in the forward direction, whereby the bias voltage applied between said base and emitter electrodes varies with temperature, a voltage divider network connected in shunt with said temperature controlled diode, circuit means connecting an intermediate point of said voltage divider network with said base electrodes, and a second diode connected in shunt with a portion of said voltage divider network and poled in a direction opposite to that of the temperature controlled diode.

8. In a signal amplifier system, the combination comprising, a transistor including base, emitter, and collector electrodes, a signal input circuit connected between said base and emitter electrodes, a signal output circuit connected with said collector electrode, a temperature controlled bias circuit for maintaining stable operation of said transistor including a temperature responsive semi-conductor diode coupled between said base and emitter electrodes, means thermally coupling said diode with said transistor to provide temperature compensation therefor with variation in the internal temperature of said transistor, and means providing a direct-current supply source connected with said diode to provide direct-current flow in the forward direction therethrough and a forward bias voltage for said base and emitter electrodes which is variable with variations in temperature to maintain stable operation of said transistor.

9. In a signal amplifier system, the combination comprising, a transistor including base, emitter, and collector electrodes, means providing a signal input circuit coupled with said base and emitter electrodes, means providing a signal output circuit coupled with said collector electrode, a temperature controlled bias circuit for maintaining stable operation of said transistor including a temperature responsive semi-conductor diode connected between said base and emitter electrodes and connected in circuit to be traversed by a direct-current in the forward direction from a substantially constant current source to vary the vias voltage between said base and emitter electrodes with temperature variations, said source being poled to provide a voltage across said diode of a polarity to provide forward bias between said base and emitter electrodes, said diode having conductive characteristics which vary in a substantially identical manner with temperature variations as said transistor, and means thermally coupling said diode with said transistor to provide temperature compensation therefor with variation in the internal temperature of said transistor.

10. A signal translating circuit comprising, in combination, a junction transistor including base, emitter, and collector electrodes, means for applying an input signal to said base electrode, means for deriving an output signal from between said collector and emitter electrodes, means providing stable operation of said transistor with variations in temperature including a semi-conductor junction diode having a first and a second electrode, a direct current supply source including a pair of terminals, means providing a direct-current conductive connection between said base electrode and said first electrode of said diode, the second electrode of said diode being connected to one terminal of said source, means connecting said emitter electrode with said one terminal of said source, and means connecting the other terminal of said source with the first electrode of said diode and with said base electrode to provide substantially constant current flow through said diode in the forward direction, said source being poled in said circuit to provide a voltage drop across said diode of a polarity to provide a forward base-emitter voltage for said transistor which is variable with variations in temperature.

11. In a signal amplifier system, the combination comprising a semi-conductor device including base, emitter and collector electrodes, a signal input circuit coupled with said base electrode, a signal output circuit coupled with said collector electrode, a temperature controlled bias circuit for maintaining a stable operation of said device including a temperature responsive semi-conductor diode coupled between said base and emitter electrodes, and direct current supply means connected to apply a forward bias to said diode to provide a predetermined direct-current flow therethrough so that the voltage developed across said diode provides a forward base-emitter bias for said semi-conductor device, said device and said diode having conductance characteristics which vary in substantially the same manner with temperature variations whereby the forward bias applied to said semi-conductor device is variable in accordance with temperature variations.

12. In a semi-conductor signal amplifier system, the combination with a semi-conductor device including base, emitter and collector electrodes, a signal input circuit coupled with said base electrode, and a signal output circut coupled with said collector electrode, of a temperature controlled bias circuit for maintaining stable semiconductor operation of said device including a temperature responsive semi-conductor diode coupled between said base and emitter electrodes and connected in circuit to be traversed in the forward direction by a predetermined direct current from a substantially constant current source, said diode being poled in said system to provide a voltage thereacross of a polarity to forward bias said emitter electrode relative to said base electrode, said device and said diode having conductive characteristics which vary in a substantially identical manner with temperature variations, whereby the forward bias voltage applied to said base and emitter electrodes is varied in accordance with temperature variations.

13. In a signal translating system, the combination comprising a semi-conductor device including base, emitter and collector electrodes, circuit means including a source of direct current connected to said electrodes to supply biasing currents thereto, and means including a forward biased junction diode connected between said base and emitter electrodes, said device and said diode having conductance characteristics which vary in substantially the same manner with temperature variations to compensate for variations in base conductance incident to changes in temperature of said transistor.

14. An electrical signal translation circuit comprising a transistor having base, emitter, and collector electrodes, input circuit means for supplying signals between said base electrode and a point of reference potential, an output circuit connected between said collector electrode and said point of reference potential, the conductance between said emitter and base electrode being subject to variations in a predetermined manner with changes in the temperature of said transistor, means for reducing said variations comprising a rectifier whose forward conductance also varies with temperature in substantially said predetermined manner, means including said rectifier in said input circuit means connected between said base electrode and said point of reference potential and means for biasing said rectifier to conduct only in the forward direction.

15. A signal translating circuit comprising, in combination, a pair of signal translating stages connected in cascade each including a transistor having base, emitter, and collector electrodes, means providing stable operation of one of said transistors with variations in temperature including a semi-conductor junction diode, means connecting said junction diode in the emitter-to-collector current path of the other of said transistors to conduct the emitter-to-collector current thereof in the forward direction, and means connecting said junction diode between the emitter and base electrode of said one transistor to compensate for variations in base conductance incident to changes in temperature of said one transistor.

16. A signal translating circuit comprising, in combination, a pair of signal translating stages connected in cascade each including a junction transistor of a common conductivity type having base, emitter, and collector electrodes, circuit means including a source of direct current connected to said electrodes to supply biasing currents thereto, the conductance between the emitter and base electrodes of one of said transistors being subject to variations in a predetermined manner with changes in the temperature of said one transistor, means for reducing said variations comprising a rectifier whose forward conductance also varies with temperature in substantially said predetermined manner, said circuit means connected to bias the other of said transistors to provide substantially constant emitter-to-collector current flow, means connecting said rectifier in the emitter-to-collector current path of the other of said transistors to conduct the emitter-to-collector current thereof in the forward direction, and means connecting said rectifier between the emitter and base electrodes of said one transistor to compensate for variations in base conductance incident to changes in temperature of said one transistor.

17. In an audio amplifier circuit including a Class A amplifier driver stage transformer coupled to drive a Class B push-pull power amplifier stage, said stages including like conductivity junction transistors each having base, emitter, and collector electrodes, the conductance between the emitter and base electrodes of said transistors being subject to variations in a predetermined manner with changes in the temperature thereof, means for reducing said variations in said Class B push-pull power amplifier stage comprising a rectifier whose forward conductance also varies with temperature in substantially said predetermined manner, means connecting said rectifier in the emitter-to-collector current path of the transistor included in said Class A amplifier driver stage to conduct current in the forward direction, and means for applying at least a portion of the voltage developed across said rectifier between the emitter and base electrodes of the transistors included in said Class B push-pull power amplifier stage to compensate for variations in the base conductance incident to changes in temperature of said transistors.

References Cited in the file of this patent

UNITED STATES PATENTS

| | | |
|---|---|---|
| 2,655,609 | Shockley | Oct. 13, 1953 |
| 2,714,702 | Shockley | Aug. 2, 1955 |
| 2,751,545 | Chase | June 19, 1956 |
| 2,757,243 | Thomas | July 31, 1956 |
| 2,759,142 | Hamilton | Aug. 14, 1956 |

OTHER REFERENCES

Bell text, "The Transistor," pages 430–436, published 1951.

Shea: "Principles of Transistor Circuits," pages 177–181, September 15, 1953.

Pearson et al.: "Silicon P–N Junction Alloy Diodes," Proc. IRE, November 1952, pages 1348–1351.